United States Patent [19]

Konishi

[11] Patent Number: 5,530,672
[45] Date of Patent: Jun. 25, 1996

[54] INTEGRATED CIRCUIT FOR OPERATION WITH PLURAL SUPPLY VOLTAGES

[75] Inventor: Haruo Konishi, Tokyo, Japan

[73] Assignee: Seiko Instruments Inc., Japan

[21] Appl. No.: 239,604

[22] Filed: May 9, 1994

[30] Foreign Application Priority Data

May 12, 1993 [JP] Japan ................................... 5-110672
Apr. 8, 1994 [JP] Japan ................................... 6-071169

[51] Int. Cl.$^6$ .............................. G11C 8/00; H03K 17/04
[52] U.S. Cl. .................... 365/189.11; 365/226; 326/81; 327/543
[58] Field of Search .............................. 365/226, 189.09, 365/189.11; 307/296.1, 296.6, 296.8, 449, 451; 327/530, 536, 538, 543; 326/81, 68

[56] References Cited

U.S. PATENT DOCUMENTS

| | | | |
|---|---|---|---|
| 4,916,334 | 4/1990 | Minagawa | 365/189.11 X |
| 4,920,287 | 4/1990 | Hartgring | 307/296.8 |
| 5,065,361 | 11/1991 | Yoshizawa | 307/296.1 |
| 5,333,122 | 7/1994 | Ninomiya | 365/189.11 |

Primary Examiner—David C. Nelms
Assistant Examiner—Son Mai
Attorney, Agent, or Firm—Adams & Wilks

[57] ABSTRACT

A semiconductor integrated circuit which operates with a single power source and has a high-tension circuit for generating a voltage higher than a power voltage and for logically processing is enabled to operate at a low power voltage by reducing the current consumed in the high-tension circuit. The semiconductor integrated circuit of the present invention comprises a block transistor 1, Vcc line circuit 2, Vpp line circuit 3 and gate potential varying circuit 4. Gate potential of the block transistor 1 is controlled by the gate potential varying circuit 4. The gate potential varying circuit 4 outputs a signal for controlling the gate potential of the block transistor 1.

5 Claims, 5 Drawing Sheets

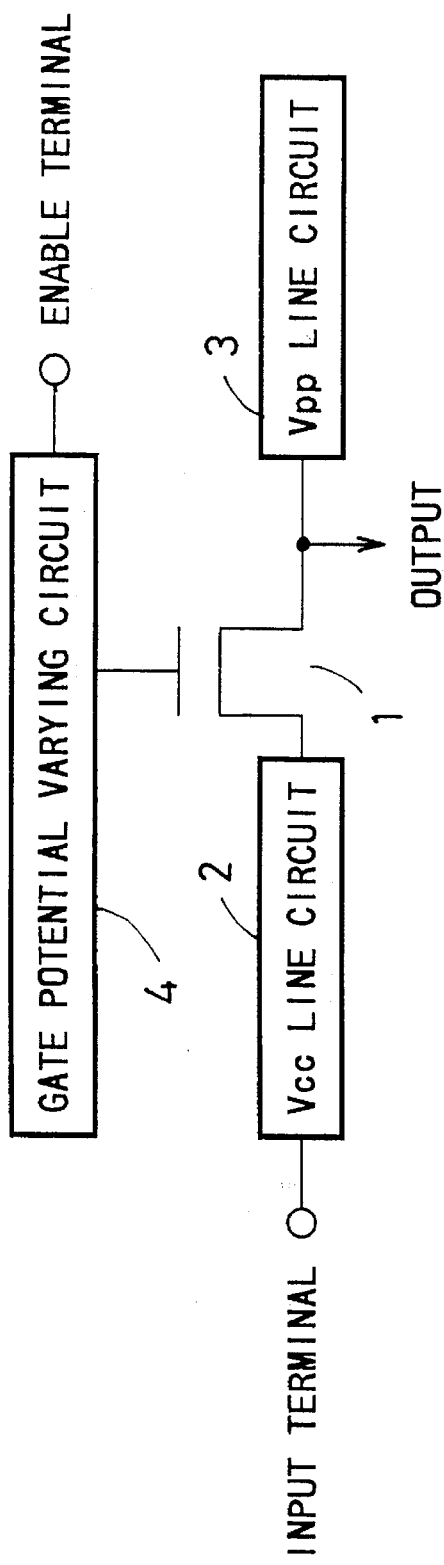
F I G. 1

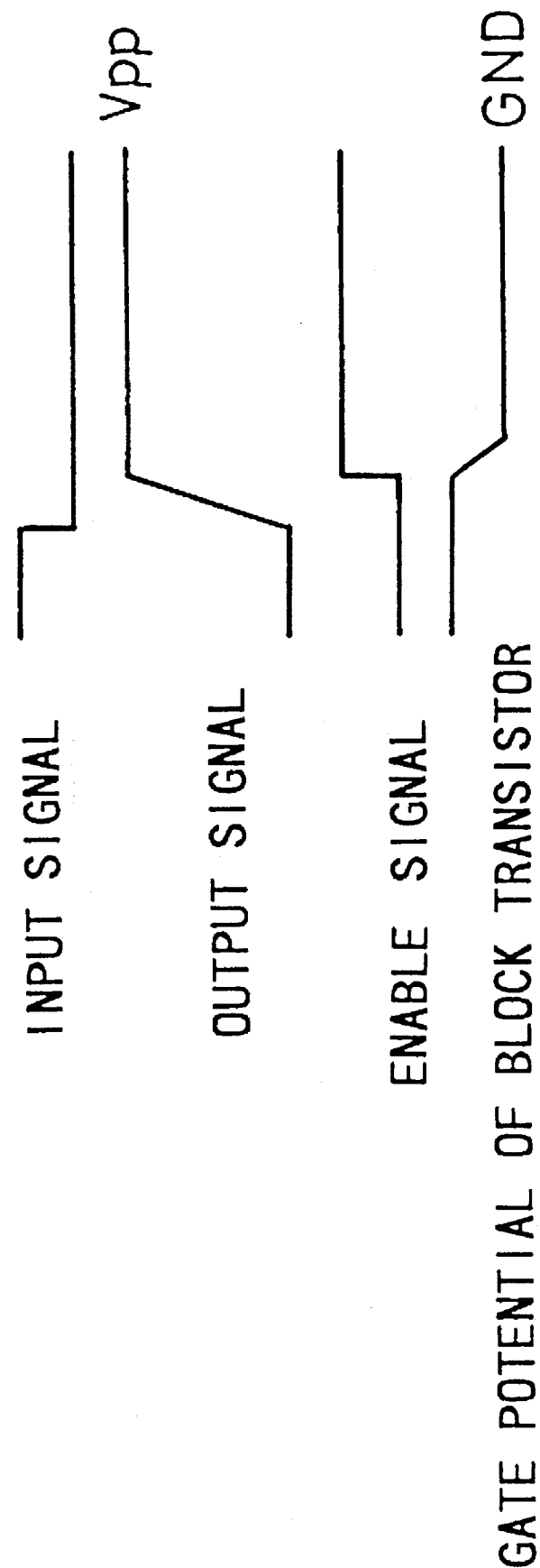

INTEGRATED CIRCUIT FOR OPERATION WITH PLURAL SUPPLY VOLTAGES

BACKGROUND OF THE INVENTION

The present invention relates to a semiconductor integrated circuit device such as a non-volatile storage device composed of a circuit operating within the range of a low voltage and a circuit operating at high voltage, and more particularly, to a semiconductor integrated circuit having a single power source and a circuit operating at a voltage higher than the power source voltage.

Conventionally, a semiconductor integrated circuit device is constructed as shown in FIG. 2, wherein a block transistor 1 is provided between a Vcc line circuit 2 and a Vpp line circuit 3 so as to output a high potential by inputting a signal to the Vcc line circuit 2. The gate potential of the block transistor 1 connecting the Vcc line circuit 2 and the Vpp line circuit 3 is fixed at Vcc.

The block transistor 1 is normally composed of an NMOS transistor having a low threshold voltage (0V for example) so that the Vcc line circuit 2 can drive the Vpp line circuit 3 efficiently. The Vcc line circuit above refers, for example, to a circuit operating at the power supply voltage or less. The Vpp line circuit refers to a circuit operating at a voltage higher than the power supply voltage and generally to a circuit or system operating at a voltage which is at least twice that of the power supply voltage, generated in a step-up circuit within an integrated circuit. However, the prior art circuit has a problem in that a current leaks from the Vpp line circuit 3 to the Vcc line circuit 2, especially when Vcc decreases driving circuit operation.

Accordingly, it is an object of the present invention to provide a semiconductor integrated circuit device which is capable of suppressing leakage from the Vpp line to the Vcc line and to also provide a semiconductor integrated circuit device which operates at a power voltage lower than 2V, as a consequence of reducing the leak current from the Vpp line to the Vcc line.

SUMMARY OF THE INVENTION

In order to solve the aforementioned problem, according to the present invention, a circuit for varying the gate potential of the block transistor is provided so as to suppress the leak current from the Vpp line to the Vcc line by reducing the gate potential of the block transistor at times when it is needed.

By constructing the semiconductor integrated circuit device as described above, in a state when the Vcc line circuit 2 outputs Vcc and the Vpp line circuit 3 outputs Vpp, i.e., when the source of the block transistor 1 is at Vcc and the drain thereof is Vpp, even if Vcc decreases and the back gate effect is weakened, the leak current from the Vpp line to the Vcc line may be suppressed by lowering the gate potential of the block transistor 1 to a potential lower than Vcc.

BRIEF DESCRIPTION OF THE DRAWINGS

These and other features, aspects and advantages of the present invention will become better understood with reference to the following description, appended claims and accompanying drawings, wherein:

FIG. 1 is a circuit block drawing of a semiconductor integrated circuit device according to the present invention;

FIG. 8 is a timing chart of the third embodiment of the present invention.

DETAILED DESCRIPTION OF THE PREFERRED EMBODIMENTS

Figure 2:
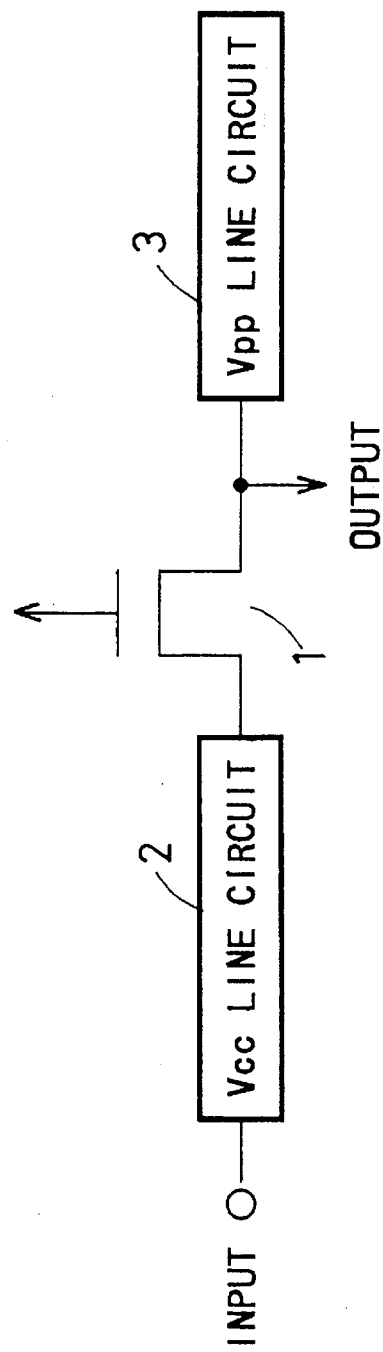
FIG. 2 is a circuit block drawing of a prior art semiconductor integrated circuit device.

Referring now to the drawings, preferred embodiments of the present invention will be explained in detail.

FIG. 1 is a circuit diagram of an embodiment of the present invention. It is constructed so that the potential of a gate electrode of a block transistor 1 is controlled by means of a gate potential varying circuit 4.

Figure 3:
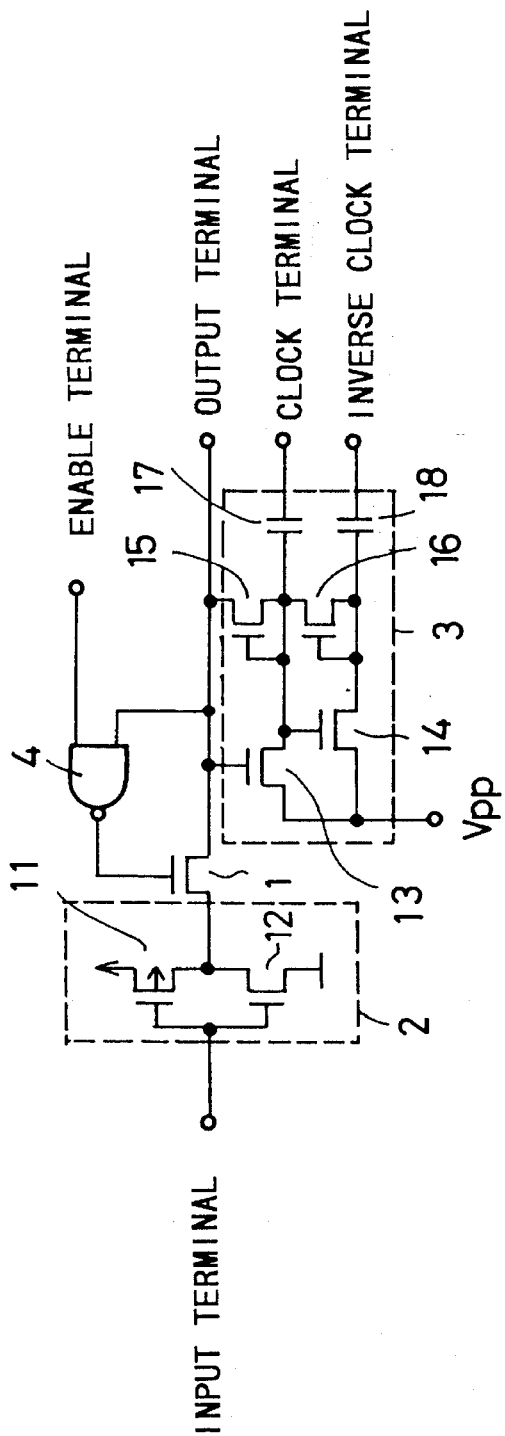
FIG. 3 is a circuit drawing showing an embodiment of the present invention.

FIG. 3 is a circuit schematic diagram showing a more detailed embodiment of the present invention, wherein an inverter circuit composed of a PMOS transistor 11 and an NMOS transistor 12 for example is used as a Vcc line circuit 2. As a Vpp line circuit 3, a high voltage switching circuit composed of NMOS transistors 13, 14, 15 and 16 and capacitors 17 and 18 is used. An output terminal is provided between the block transistor 1 and the Vpp line circuit 3. A NAND circuit is used as the gate potential varying circuit 4.

The gates of the PMOS transistor 11 and NMOS transistor 12 comprising the inverter circuit 2 are connected in common to an input terminal, and the respective drains thereof are connected in common to the source of the block transistor 1. The source of the PMOS transistor 11 and the source of the NMOS transistor 12 are respectively connected to a Vcc terminal and a ground terminal.

The drains of the NMOS transistors 13 and 14 composing the high voltage switching circuit 3 are connected in common to a Vpp terminal and the gate of the NMOS transistor 13 is connected to the output terminal, while the source thereof is connected to the gate of the NMOS transistor 14, the drain and gate of the NMOS transistor 15, the source of the NMOS transistor 16, and the capacitor 17. The source of the NMOS transistor 14 is connected to the drain and gate of the NMOS transistor 16 and to the capacitor 18. The source of the NMOS transistor 15 is connected to the output terminal. Further, the capacitor 17 is connected to a clock terminal and the capacitor 18 is connected to an inverse clock terminal.

One input terminal of the NAND circuit 4 is connected to the output terminal and another input terminal is connected to an enable terminal. An output terminal of the NAND circuit 4 is connected to the gate of the block transistor 1. A drain of the block transistor 1 is connected to the output terminal.

Figure 4:
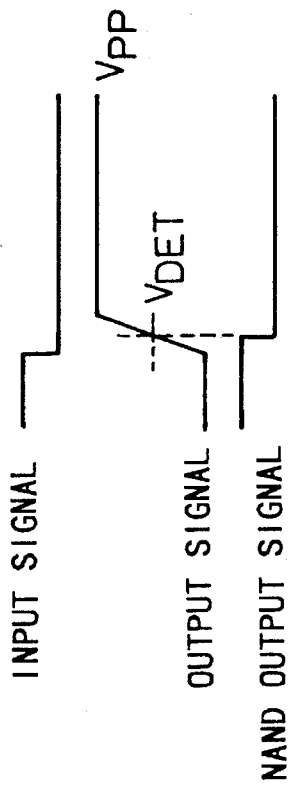
FIG. 4 its a timing chart of the first embodiment.

In operation, an input signal which turns from "H" level to "L" level as shown in a waveform chart in FIG. 4 is applied to the input terminal when a high voltage Vpp is to be transmitted to the output. Then the inverter circuit 2 detects the "L" level and outputs "H" level to the source of the block transistor 1. Because the output terminal is at "L" level until the inverter circuit 2 outputs the "H" level, the NAND circuit 4 outputs "H" level and the gate of the block transistor 1 is also at "H" level. Therefore, when the inverter circuit 2 outputs "H" level, the block transistor 1 transmits this potential to the output terminal. Because Vpp is applied to the Vpp terminal and clocks having a peak value of Vcc are sent to the clock terminal and inverse clock terminal at this time, the high voltage switching circuit 3 transmits Vpp to the output terminal. Because the enable terminal is at "H" level at this time, the NAND circuit 4 outputs "L" level when the level of the output terminal exceeds an inverse level VDET of the NAND circuit 4 as shown in the waveform chart in FIG. 4. Then the block transistor 1 is switched to an OFF state, allowing it to suppress a leak current from the Vpp line to Vcc line.

That is, the gate potential varying circuit of the present invention is controlled by the signal of the fed back output terminal which depends upon the signal at the input terminal. The high voltage switching circuit 3 continues to operate and transmits Vpp which is higher than the power voltage to the output terminal if the level of the output terminal has been increased to a degree by which the NMOS transistor 13 which composes the high voltage switching circuit 3 would not be turned OFF even if the block transistor 1 is turned into the OFF state.

Next, when "H" level is to be transmitted to the output terminal through the inverter circuit 2 without activating the high voltage switching circuit 3, because the NAND circuit 4 outputs "H" level by fixing the enable terminal at "L" level, the block transistor 1 is turned into ON state and "H" level of the power voltage may be transmitted to the output terminal by applying "L" level to the input terminal.

The power voltage Vcc described above is a voltage generally within a range from 0.5 to 5 V and the high voltage Vpp is a voltage double or more the value of Vcc. The present invention is especially useful for transferring or blocking a current efficiently when the block transistor 1 is an insulated gate field effect transistor and is constructed so as to receive a substrate effect by grounding a substrate thereof to a ground potential of the power source. In order to effectively block a current using the substrate effect, a threshold value of the block transistor 1 is most preferably within a range of ±0.15 V.

Figure 5:
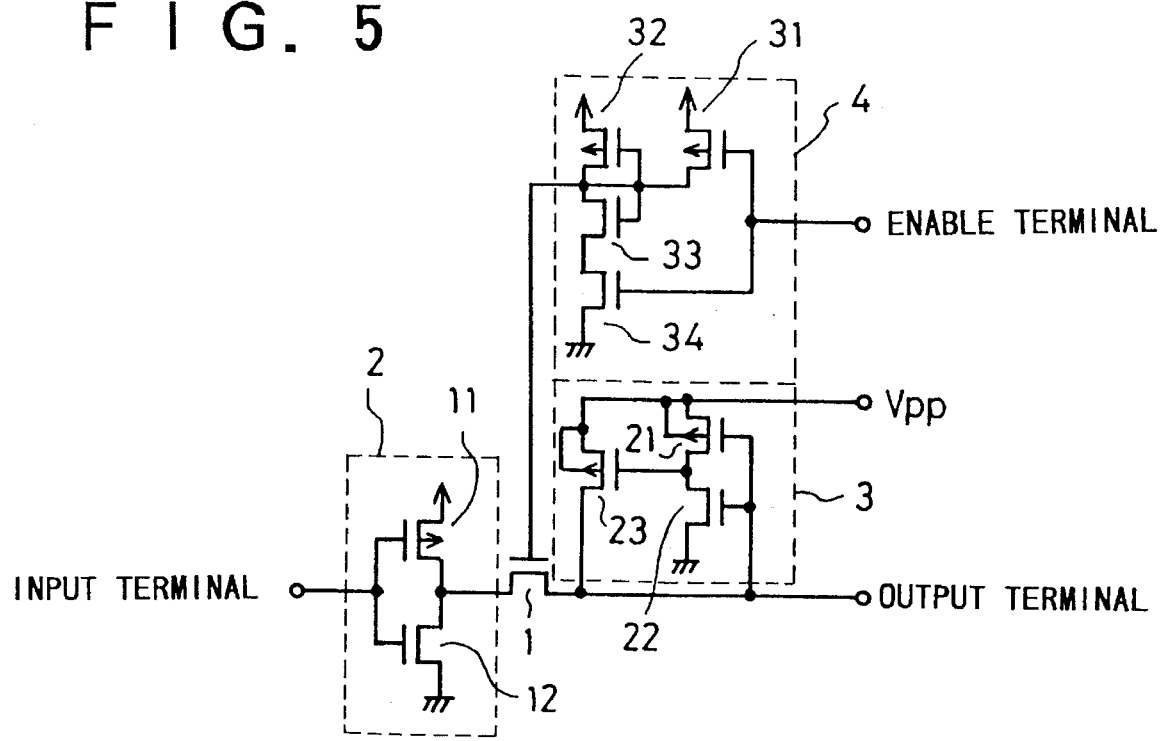
FIG. 5 is a circuit drawing showing a second embodiment of the present invention.

FIG. 5 is a circuit diagram showing a second embodiment of the present invention, wherein the inverter circuit composed of the PMOS transistor 11 and the NMOS transistor 12 for example is used for the Vcc line circuit 2. For the Vpp line circuit 3, a high voltage switching circuit composed of PMOS transistors 21 and 23 and a NMOS transistor 22 is used. The output terminal is provided between the block transistor 1 and the Vpp line circuit 3. A circuit, composed of PMOS transistors 31 and 32 and NMOS transistors 33 and 34 is used as the gate potential varying circuit 4.

The gates of the PMOS transistor 11 and NMOS transistor 12 composing the inverter circuit 2 are connected in common to the input terminal and respective drains are connected in common to the source of the block transistor 1. The source of the PMOS transistor 11 is connected to the Vcc terminal and the source of the NMOS transistor 12 is connected to the ground terminal.

Gates of the PMOS transistor 21 and NMOS transistor 22 composing the high voltage switching circuit 3 are connected in common to the output terminal and respective drains are connected in common to a gate of the PMOS transistor 23. The drain of the PMOS transistor 23 is connected to the output terminal. Sources of the PMOS transistors 21 and 23 and the substrate are connected to the Vpp terminal and a source of the NMOS transistor 22 is connected to the ground terminal. Gates of the PMOS transistor 31 and NMOS transistor 34 composing the gate potential varying circuit 4 are connected in common to the enable terminal. Gates and drains of the PMOS transistor 32 and NMOS transistor 33 are connected all in common to the drain of the PMOS transistor 31 and to the gate of the block transistor 1. A source of the NMOS transistor 33 is connected to a drain of the NMOS transistor 34. Further, sources of the PMOS transistors 31 and 32 are connected to the Vcc terminal in common and a source of the NMOS transistor 34 is connected to the ground terminal. Further, the drain of the block transistor 1 is connected to the output terminal. The operation of this circuit will now be explained.

The operation of the gate potential varying circuit 4 will be explained first. Because the PMOS transistor 31 is turned to an ON state and the NMOS transistor 34 is turned to an OFF state when an enable signal is at "L" level, the output of the gate potential varying circuit 4, i.e. the gate of the block transistor 1, is turned to "H" level. Further, because the PMOS transistor 31 is turned to an OFF state and the NMOS transistor 34, PMOS transistor 32 and NMOS transistor 33 are turned to an ON state when the enable signal is at "H" level, the gate potential of the block transistor 1 becomes an intermediate potential between the and ground potential or 0.5 ×Vcc, for example.

Figure 6:
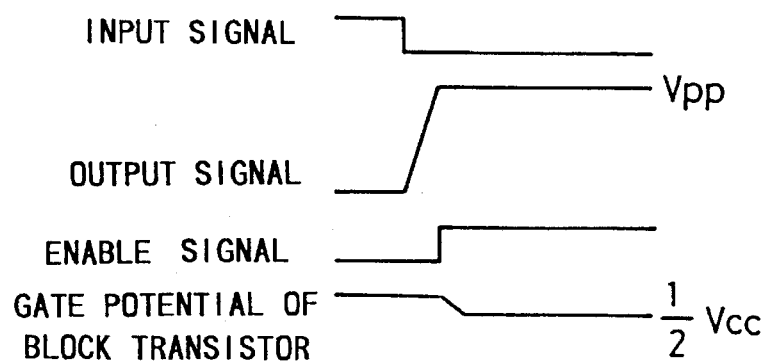
FIG. 6 is a timing chart of the second embodiment of the present invention.

Next, when a high voltage Vpp is to be transmitted to the output terminal, a signal which turns from "H" level to "L" level as shown in a waveform chart in FIG. 6 is applied to the input terminal. Then the inverter circuit 2 detects the "L" level and outputs "H" level to the source of the block transistor 1. Because the gate potential of the block transistor 1 is turned to "H" level as described before by applying "L" level to the enable terminal as shown in the waveform chart in FIG. 6, the block transistor 1 transmits "H" level to the output terminal. When the output terminal switches to "H" level, the NMOS transistor 22 which composes the high voltage switching circuit 3 switches to an ON state causing the gate potential of the PMOS transistor 23 to switch to "L" level and the PMOS transistor 23 to switch to ON state. If Vpp is applied to the Vpp terminal at this time, the PMOS transistor 23 transmits Vpp to the output terminal. However, a leak current flows from the drain to the source of the block transistor 1 if the gate potential of the block transistor 1 remains at "H" level. Then the enable signal is switched to "H" level as shown in the waveform chart in FIG. 6 to reduce the gate potential of the block transistor 1 to an intermediate potential or 0.5×Vcc for example. Hence the leak current may be reduced.

Figure 7:
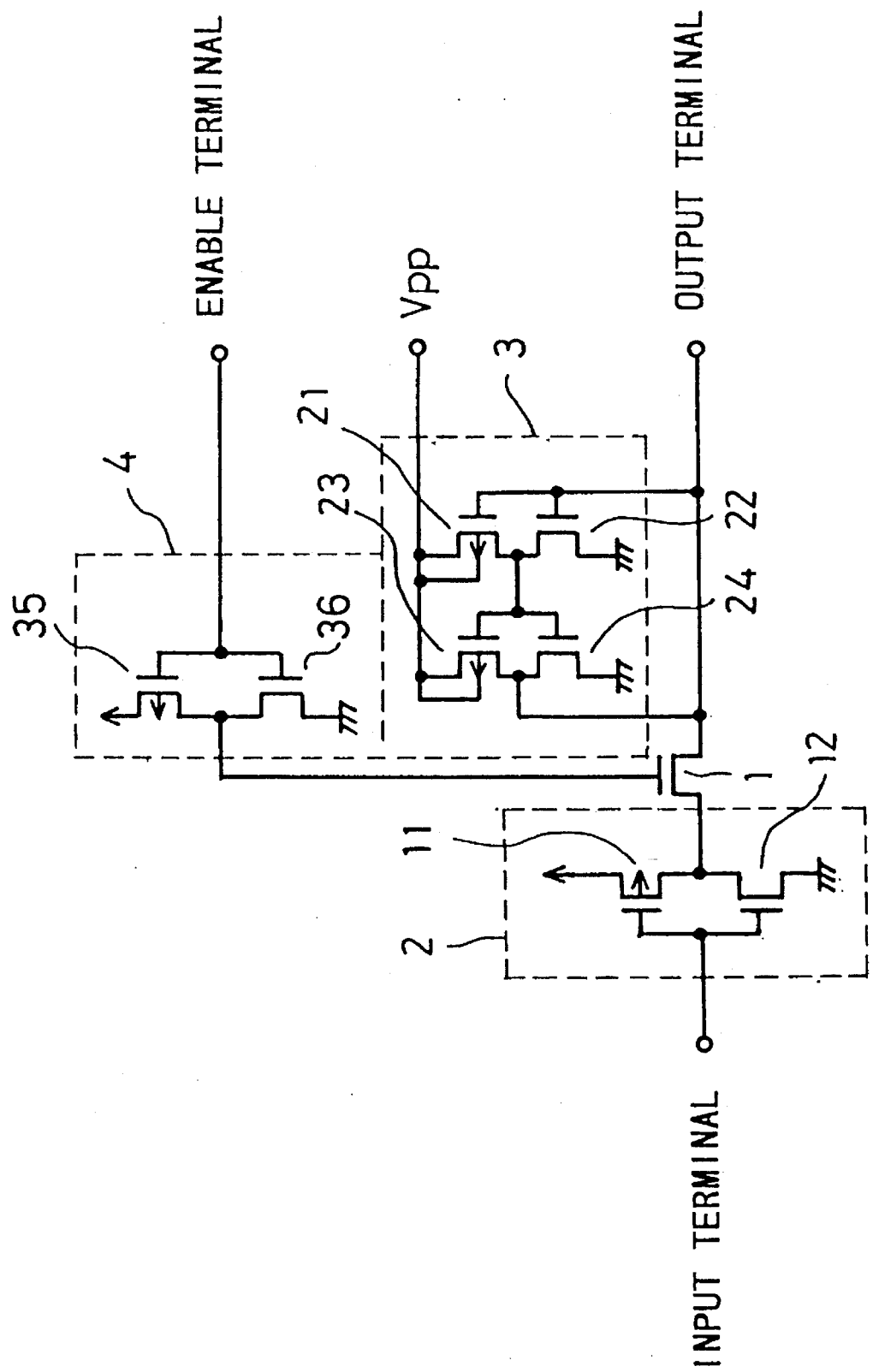
FIG. 7 is a circuit drawing showing a third embodiment of the present invention.

FIG. 7 is a circuit diagram showing a third embodiment of the present invention, wherein the inverter circuit composed of the PMOS transistor 11 and NMOS transistor 12 for example is used for the Vcc line circuit 2. For the Vpp line circuit 3, a high voltage switching circuit composed of the PMOS transistors 21 and 23 and NMOS transistors 22 and 24 is used. The output terminal is provided between the block transistor 1 and the Vpp line circuit 3. A circuit composed of PMOS transistors 35 and an NMOS transistor 36 is used as the gate potential varying circuit 4.

The gates of the PMOS transistor 11 and NMOS transistor 12 composing the inverter circuit 2 are connected in common to the input terminal and respective drains are connected in common to the source of the block transistor 1. The source of the PMOS transistor 11 is connected to the Vcc terminal and the source of the NMOS transistor 12 is connected to the ground terminal.

The gates of the PMOS transistor 21 and NMOS transistor 22 composing the high voltage switching circuit 3 are connected in common to the output terminal and respective drains are also connected in common to the gates of the PMOS transistor 23 and NMOS transistor 24. The drains of the PMOS transistor 23 and NMOS transistor 24 are connected in common to the output terminal. The sources of the PMOS transistors 21 and 23 and the substrate are connected to the Vpp terminal and the sources of the NMOS transistors 22 and 24 are connected to the ground terminal.

Gates of the PMOS transistor 35 and NMOS transistor 36 composing the gate potential varying circuit 4 are connected in common to the enable terminal and respective drains are connected in common to the gate of the block transistor 1. The source of the PMOS transistor 35 and that of the NMOS transistor 36 are connected respectively to the Vcc terminal and the ground terminal. The drain of the block transistor 1 is connected to the output terminal. The operation of the above circuit will now be explained.

When a high voltage Vpp is to be transmitted to the output terminal, a signal which switches from "H" level to "L" level as shown in the waveform chart of FIG. 8 is applied to the input terminal. Then the inverter circuit 2 detects the "L" level and outputs "H" level to the source of the block transistor 1. Because the PMOS transistor 35 which composes the gate potential varying circuit 4 is switched to an ON state and the NMOS transistor 36 is switched to an OFF state and the output of the gate potential varying circuit 4, i.e. the gate potential of the block transistor 1, switches to "H" level when "L" level as shown in the waveform chart in FIG. 8 is applied to the enable terminal at this time, the block transistor 1 transmits "H" level to the output terminal. When the output terminal switches to "H" level, the NMOS transistor 22 which composes the high voltage switching circuit 3 switches to an ON state, causing the gate potential of the PMOS transistor 23 and NMOS transistor 24 to switch to "L" level and the PMOS transistor 23 to switch to an ON state and the NMOS transistor 24 to switch to an OFF state. If Vpp is applied to the Vpp terminal at this time, the PMOS transistor 23 transmits Vpp to the output terminal. However, a leak current flows from the drain to the source of the block transistor 1 if the gate potential of the block transistor 1 remains at "H" level. In order to avoid this, when the enable signal is turned into "H" level as shown in the waveform chart in FIG. 8, the PMOS transistor 35 switches to an OFF state and the NMOS transistor 36 switches to an ON state, causing the gate potential of the block transistor 1 to switch to "L" level and allowing the reduction of the leak current from the drain to the source.

As described above, according to the present invention, leakage from the Vpp line circuit to the Vcc line circuit may be suppressed by arranging a very simple circuit which is effective for reducing power during operation and for lowering the voltage in a non-volatile memory and the like in which a step-up circuit is provided.

What is claimed is:

1. A semiconductor integrated circuit device comprising: a Vcc line circuit operating within a range of a power supply voltage; a Vpp line circuit operating at a voltage higher than the power supply voltage; a block transistor disposed between the Vcc line circuit and the Vpp line circuit; an output terminal provided between the block transistor and the Vpp line circuit; a gate potential varying circuit electrically connected to the output terminal for varying a gate potential of the block transistor so that the electrical connection between the Vcc line circuit and the Vpp line circuit is controlled by the gate potential varying circuit.

2. A semiconductor integrated circuit device according to claim 1; wherein the block transistor has a gate, a source, and a drain, the gate, the source, and the drain being electrically connected to the gate potential varying circuit, the Vcc line circuit, and the Vpp line circuit, respectively, and the output terminal being electrically connected to the drain.

3. A semiconductor integrated circuit device according to claim 2; wherein the gate potential varying circuit comprises a NAND circuit, a first input terminal of the NAND circuit being connected to the drain of the block transistor, a second input terminal of the NAND circuit being supplied with an enable signal, and an output terminal of the NAND circuit being connected to the gate of the block transistor.

4. A semiconductor integrated circuit device comprising: a Vcc line circuit operating within a range of a power supply voltage; a Vpp line circuit operating at a voltage higher than the power supply voltage; a block transistor disposed between the Vcc line circuit and the Vpp line circuit; and a gate potential varying circuit for varying a gate potential of the block transistor so that the electrical connection between the Vcc line and the Vpp line circuit is controlled by the gate potential varying circuit; wherein the gate potential varying circuit outputs an intermediate voltage between a ground level and the power supply voltage to the gate of the block transistor.

5. A semiconductor integrated circuit device according to claim 4; wherein the gate potential varying circuit comprises an inverter circuit, an input terminal of the inverter circuit being supplied with an enable signal, and an output terminal of the inverter circuit being connected to the gate of the block transistor.

* * * * *